(12) United States Patent
Ching et al.

(10) Patent No.: US 12,266,654 B2
(45) Date of Patent: Apr. 1, 2025

(54) FINFET DEVICES AND METHODS OF FORMING THE SAME

(71) Applicant: Taiwan Semiconductor Manufacturing Co., Ltd., Hsinchu (TW)

(72) Inventors: Kuo-Cheng Ching, Hsinchu County (TW); Chih-Hao Wang, Hsinchu County (TW); Huan-Chieh Su, Changhua County (TW); Mao-Lin Huang, Hsinchu (TW); Zhi-Chang Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 232 days.

(21) Appl. No.: 16/215,676

(22) Filed: Dec. 11, 2018

(65) Prior Publication Data
US 2020/0043919 A1 Feb. 6, 2020

Related U.S. Application Data

(60) Provisional application No. 62/712,236, filed on Jul. 31, 2018.

(51) Int. Cl.
*H01L 21/28* (2006.01)
*H01L 21/8234* (2006.01)
*H01L 27/088* (2006.01)
*H01L 29/417* (2006.01)
*H01L 29/423* (2006.01)
(Continued)

(52) U.S. Cl.
CPC .... *H01L 27/0886* (2013.01); *H01L 21/28114* (2013.01); *H01L 21/823431* (2013.01); *H01L 21/823437* (2013.01); *H01L 21/823468* (2013.01); *H01L 21/823481* (2013.01); *H01L 29/41791* (2013.01); *H01L 29/42376* (2013.01); *H01L 29/66545* (2013.01); *H01L 29/6656* (2013.01); *H01L 29/66795* (2013.01); *H01L 29/7851* (2013.01); *H01L 29/4991* (2013.01)

(58) Field of Classification Search
CPC ........... H01L 29/66545; H01L 27/0886; H01L 29/66795; H01L 29/785; H01L 29/42376; H01L 21/823431; H01L 29/6656; H01L 29/0649; H01L 21/28114; H01L 21/823468; H01L 21/823481; H01L 29/41791; H01L 21/764; H01L 21/823437; H01L 29/4991; H01L 29/7851
USPC ......... 257/288, 368, 21.19, 21.409; 438/182, 438/283, 424, 591
See application file for complete search history.

(56) References Cited

U.S. PATENT DOCUMENTS

| 2011/0115032 A1* | 5/2011 | Mo | ...................... H01L 29/7833 257/408 |
| 2014/0159142 A1* | 6/2014 | Lim | ...................... H01L 29/7834 438/270 |

(Continued)

*Primary Examiner* — David Chen
(74) *Attorney, Agent, or Firm* — JCIPRNET

(57) ABSTRACT

Provided are FinFET devices and methods of forming the same. A FinFET device includes a substrate, a metal gate strip, gate spacers and a dielectric helmet. The substrate has fins. The metal gate strip is disposed across the fins and has a reversed T-shaped portion between two adjacent fins. The gate spacers are disposed on opposing sidewalls of the metal gate strip. A dielectric helmet is disposed over the metal gate strip.

20 Claims, 10 Drawing Sheets

(51) Int. Cl.
*H01L 29/66* (2006.01)
*H01L 29/78* (2006.01)
*H01L 29/49* (2006.01)

(56) References Cited

U.S. PATENT DOCUMENTS

| | | | | |
|---|---|---|---|---|
| 2015/0228754 | A1* | 8/2015 | Sung | H01L 21/76224 |
| | | | | 438/595 |
| 2015/0228763 | A1* | 8/2015 | Lin | H01L 29/66795 |
| | | | | 438/424 |
| 2015/0243747 | A1* | 8/2015 | Kittl | H01L 29/41791 |
| | | | | 257/401 |
| 2015/0287827 | A1* | 10/2015 | Leobandung | H01L 21/823468 |
| | | | | 257/288 |
| 2015/0294874 | A1* | 10/2015 | Lin | H01L 29/785 |
| | | | | 438/585 |
| 2016/0365426 | A1* | 12/2016 | Ching | H01L 29/6656 |
| 2017/0033178 | A1* | 2/2017 | Krishnan | H01L 29/7851 |
| 2017/0040439 | A1* | 2/2017 | Chang | H01L 29/66795 |
| 2017/0077256 | A1* | 3/2017 | Adusumilli | H01L 21/28088 |
| 2017/0092543 | A1* | 3/2017 | Ok | H01L 29/42356 |
| 2017/0186849 | A1* | 6/2017 | Chen | H01L 21/76883 |
| 2017/0229452 | A1* | 8/2017 | Chang | H01L 29/0649 |
| 2017/0317079 | A1* | 11/2017 | Kim | H01L 27/0207 |
| 2017/0345912 | A1* | 11/2017 | Kim | H01L 29/4966 |
| 2017/0352659 | A1* | 12/2017 | Basker | H01L 29/401 |
| 2017/0352744 | A1* | 12/2017 | Basker | H01L 21/3065 |
| 2018/0277571 | A1* | 9/2018 | Chang | H01L 21/823431 |
| 2019/0378903 | A1* | 12/2019 | Jeon | H01L 21/823431 |

\* cited by examiner

FINFET DEVICES AND METHODS OF FORMING THE SAME

CROSS-REFERENCE TO RELATED APPLICATION

This application claims the priority benefits of U.S. provisional application Ser. No. 62/712,236, filed on Jul. 31, 2018. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
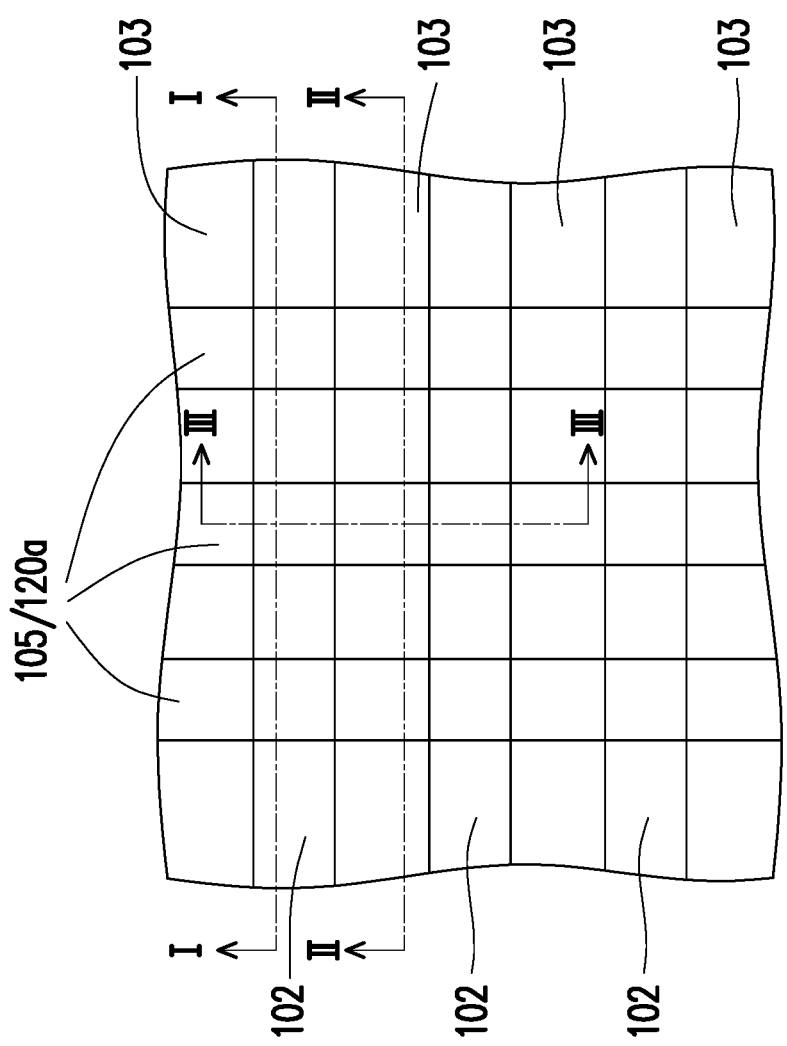
FIG. 1 is a simplified top view of a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified top view of a FinFET device in accordance with some embodiments, in which few elements such as fins, dummy gate strips, isolation strips and metal gate strips are shown for simplicity and clarity of illustration. FIG. 2A to FIG. 2H are schematic cross-sectional views of a method of forming a FinFET device in accordance with some embodiments, which are taken along the lines I-I and II-II and III-III of FIG. 1.

Figure 2A:
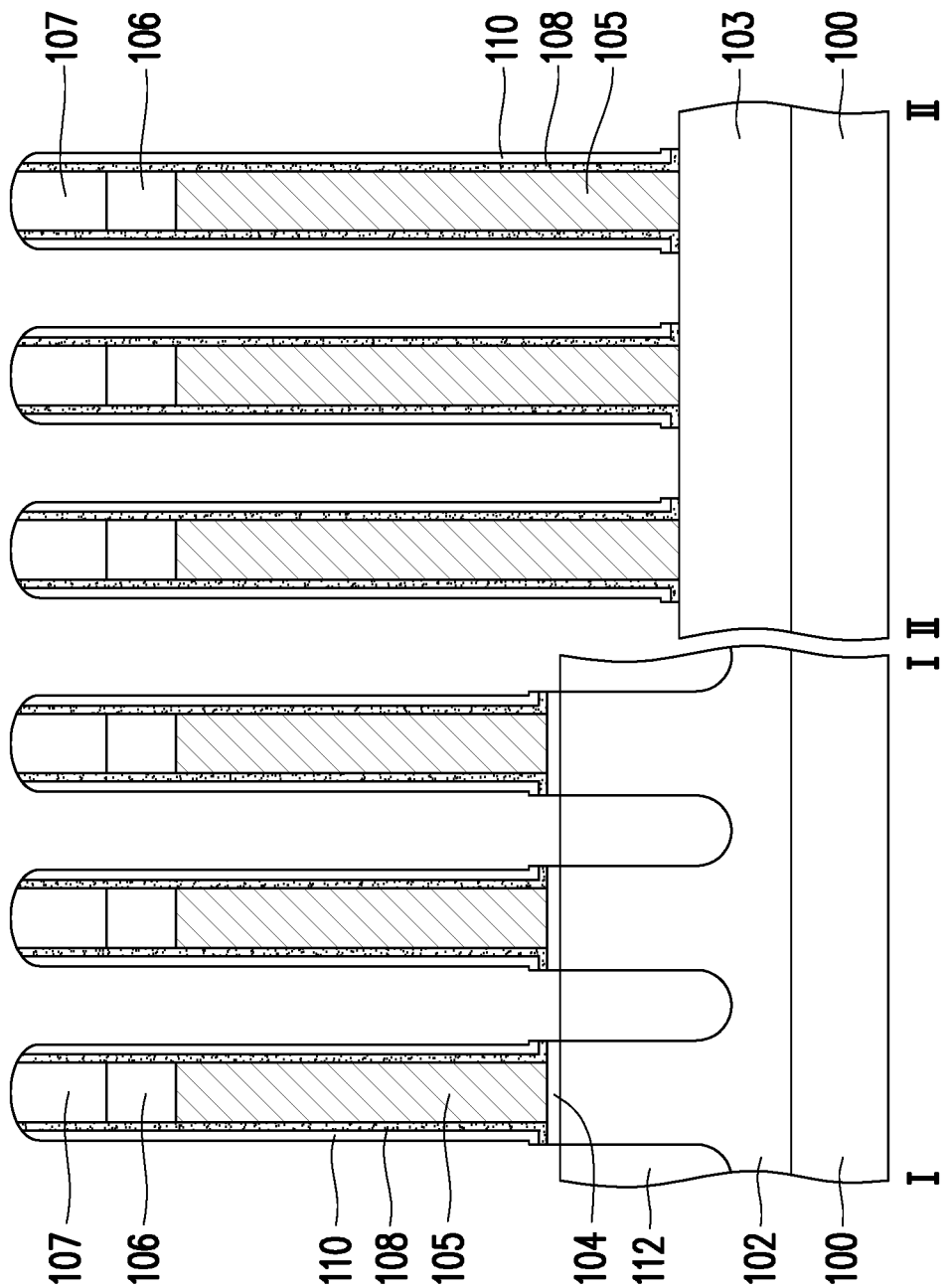
FIG. 2A to FIG. 2H are schematic cross-sectional views of a method of forming a FinFET device in accordance with some embodiments.

Referring to FIG. 1 and FIG. 2A, a substrate 100 is provided with one or more fins 102 extending in a direction. In some embodiments, the substrate 100 includes a silicon-containing substrate, a silicon-on-insulator (SOI) substrate, or a substrate formed of other suitable semiconductor materials. The substrate 100 and the fins 102 may be made by the same material or different materials. Depending on the requirements of design, the substrate 100 may be a P-type substrate or an N-type substrate and may have doped regions therein. The doped regions may be configured for a P-type FinFET device or an N-type FinFET device. In some embodiments, the substrate 100 has multiple isolation strips 103 formed thereon. Specifically, the isolation strips 103 cover lower portions of the fins 102 and expose upper portions of the fins 102. The isolation strips 103 and the fins 102 are arranged alternately. In some embodiments, the isolation strips 103 are shallow trench isolation (STI) structures.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

One or more dummy gate strips 105 are formed over the substrate 100. In some embodiments, the dummy gate strips 105 extend in a direction different from (e.g., perpendicular to) the extending direction of the fins 102. In some embodiments, each of the dummy gate strips 105 is formed across the fins 102 and the isolation strips 103, and therefore has an uneven or wavy bottom surface. In some embodiments, each of the dummy gate strips 105 includes a silicon-containing material such as polysilicon, amorphous silicon or a combination thereof. In some embodiments, first hard mask patterns 106 and second hard mask patterns 107 are optionally provided over the dummy gate strips 105. In some embodiments, the first hard mask patterns include silicon nitride, and the second hard mask patterns 107 include silicon oxide. The method of forming the dummy gate strips 105, the first hard mask patterns 106 and the second hard mask patterns 107 includes performing multiple suitable deposition processes followed by photolithography etching processes.

In some embodiments, multiple interfacial layers 104 are respectively formed between the dummy gate strips 105 and the substrate 100. In some embodiments, each of the interfacial layers 104 includes silicon oxide, and the forming method thereof includes performing a thermal process or a deposition process. In some embodiments, when the interfacial layers 104 are formed by a thermal process, the interfacial layers 104 are formed between the dummy gate strips 105 and the fins 102 but not between the dummy gate strips 105 and the isolation strips 103, as shown in FIG. 2A. However, the present disclosure is not limited thereto. In alternative embodiments, when the interfacial layers 104 are formed by a deposition process, the interfacial layers 104 are formed not only between the dummy gate strips 105 and the fins 102 but also between the dummy gate strips 105 and the isolation strips 103.

The dummy gate strips 105 may respectively have inner gate spacers 108 and outer gate spacers 110 on opposing sidewalls thereof. In some embodiments, the gate spacers 108 and 110 are formed on the opposing sidewalls of the first and second hard mask patterns 106 and 107. In some embodiments, the method of forming the gate spacers 108 and 110 includes depositing multiple spacer material layers conformally on the substrate 100 and performing an anisotropic process to remove the horizontal parts but leave the vertical parts of the spacer material layers. A trimming process may be optionally performed to the outer gate spacers. In some embodiments, each of the gate spacers 108 and 110 is formed across the fins 102 and the isolation strips 103, and therefore has an uneven or wavy bottom surface. In some embodiments, each of the gate spacers 108 and 110 includes a low-k (LK) material having a dielectric constant less than about 4 or about 3.5. The low-k material included in the gate spacers 108 may have a dielectric constant different from or the same as that of the low-k material included in the gate spacers 110. In some embodiments, each of the gate spacers 108 and 110 has an L-shaped in cross-section, as shown in FIG. 2A. However, the present disclosure is not limited thereto. In alternative embodiments, each of the gate spacers 108 has an L-shaped in cross-section, and each of the gate spacers 110 has an I-shaped in cross-section.

Thereafter, strained layers 112 are formed in the substrate 100 aside the dummy gate strips 105. In some embodiments, two strained layers 112 are formed beside each of the dummy gate strips 105, and one of the strained layers 112 is between the adjacent dummy gate strips 105. In some embodiments, the strained layers 112 include silicon germanium (SiGe) for a P-type FinFET device. In alternative embodiments, the strained layers 112 include silicon carbon (SiC), silicon phosphate (SiP), SiCP or a SiC/SiP multi-layer structure for an N-type FinFET device. In some embodiments, the strained layers 112 may be optionally implanted with a P-type dopant or an N-type dopant as needed. In some embodiments, the method of forming the strained layers 112 includes forming recesses in the fins 102, and growing epitaxy layers from the recesses. In some embodiments, the strained layers 112 are referred to as source/drain regions.

Figure 2B:
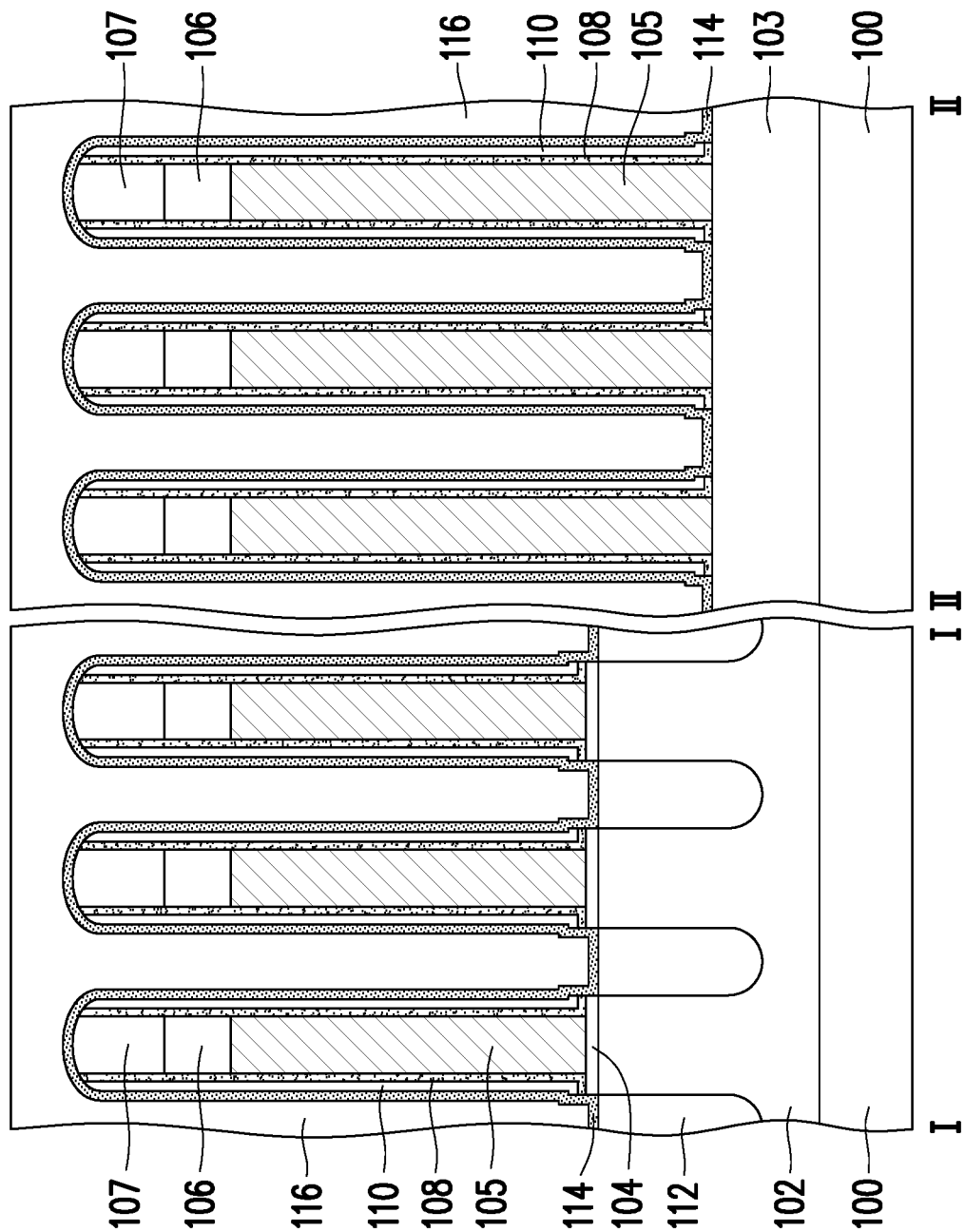

Referring to FIG. 2B, a dielectric layer 116 is formed over the substrate 100 aside or around the dummy gate strips 105. In some embodiments, the dielectric layer 116 includes oxide such as silicon oxide, phosphosilicate glass (PSG), borosilicate glass (BSG), boron-doped phosphosilicate glass (BPSG), a combination thereof or the like. In some embodiments, an etch stop layer 114 is formed after the operation of forming the strained layers 112 and before the operation of forming the dielectric layer 116. In some embodiments, the etch stop layer 114 includes SiN, SiC or the like. In some embodiments, the etch stop layer 114 is referred to as a contact etch stop layer (CESL). In some embodiments, after the operation of forming the strained layers 112, an etch stop material layer and a dielectric material layer are formed on the substrate 100 filling gaps between the dummy gate strips 105 by a suitable deposition technique such as spin-coating, CVD, PVD, ALD, a combination thereof or the like.

Figure 2C:
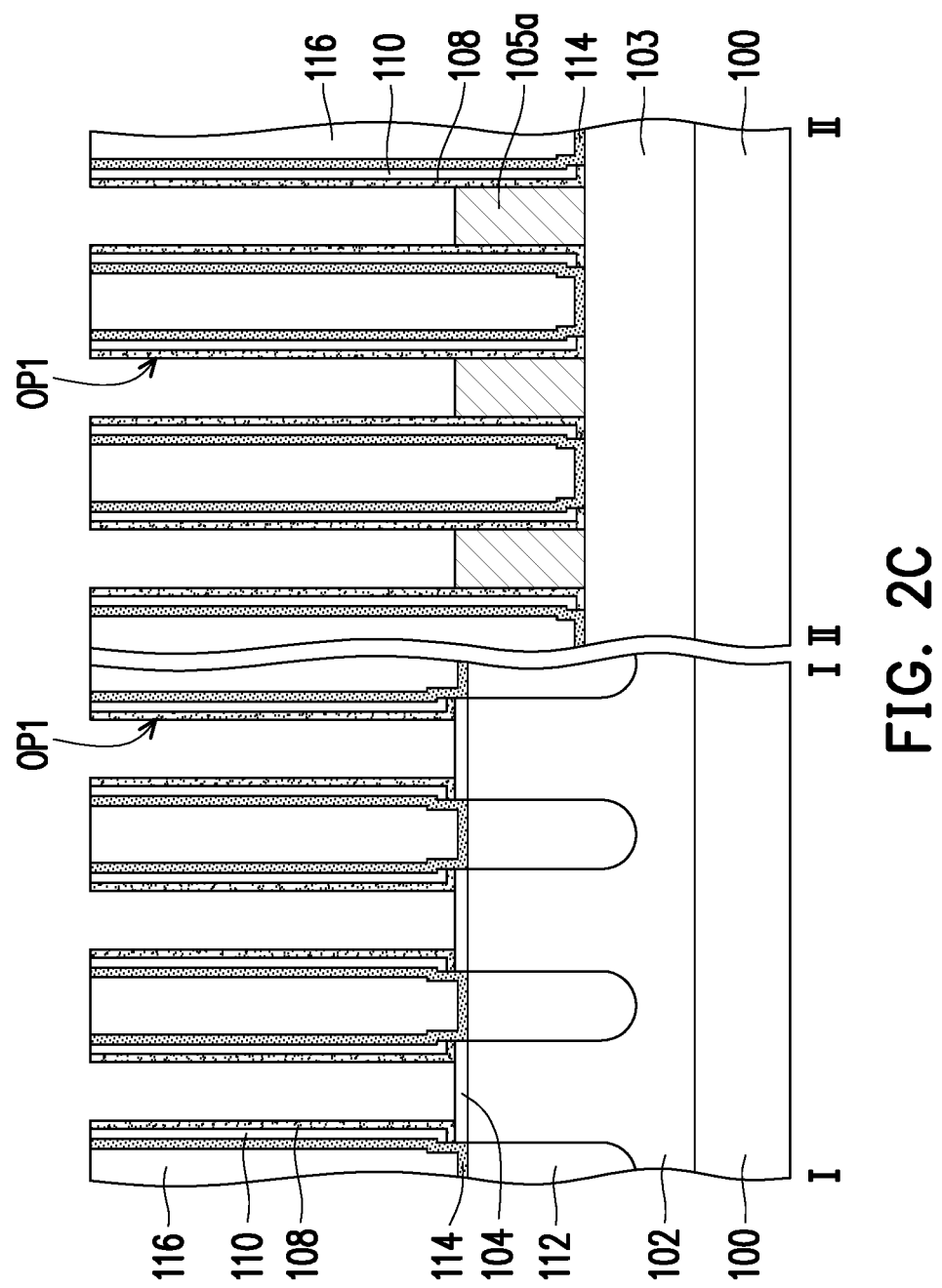

Referring to FIG. 2C, the dielectric material layer and the etch stop material layer are planarized by a suitable technique such as CMP. The first and second hard mask patterns 106 and 107 may be removed by the planarization operation, until the top surfaces of the dummy gate strips 105 are exposed. In some embodiments, the top surfaces of the dielectric layer 116 and the etch stop layer 114 are substantially coplanar with the top surfaces of the dummy gate strips 105.

Still referring to FIG. 2C, first portions of the dummy gate strips 105 above the fins 102 are removed, and therefore, first openings OP1 are formed in the dielectric layer 116. In some embodiments, the upper portions of the dummy gate strips 105 are removed by using the interfacial layers 104 as etch stop layers, and thus, the portions of the dummy strips 105 above the level of the interfacial layers 104 are removed, while the portions of the dummy strips 105 below the level of the interfacial layers 104 remain. Accordingly, the first openings OP1 expose the interfacial layers 104 above the fins 102 and expose the remaining dummy gate strips 105a above the isolation strips 103 between the fins 102. In some embodiments, the top surfaces of the interfacial layers 104 are substantially level with the top surfaces of the remaining dummy gate strips 105a.

Figure 2D:
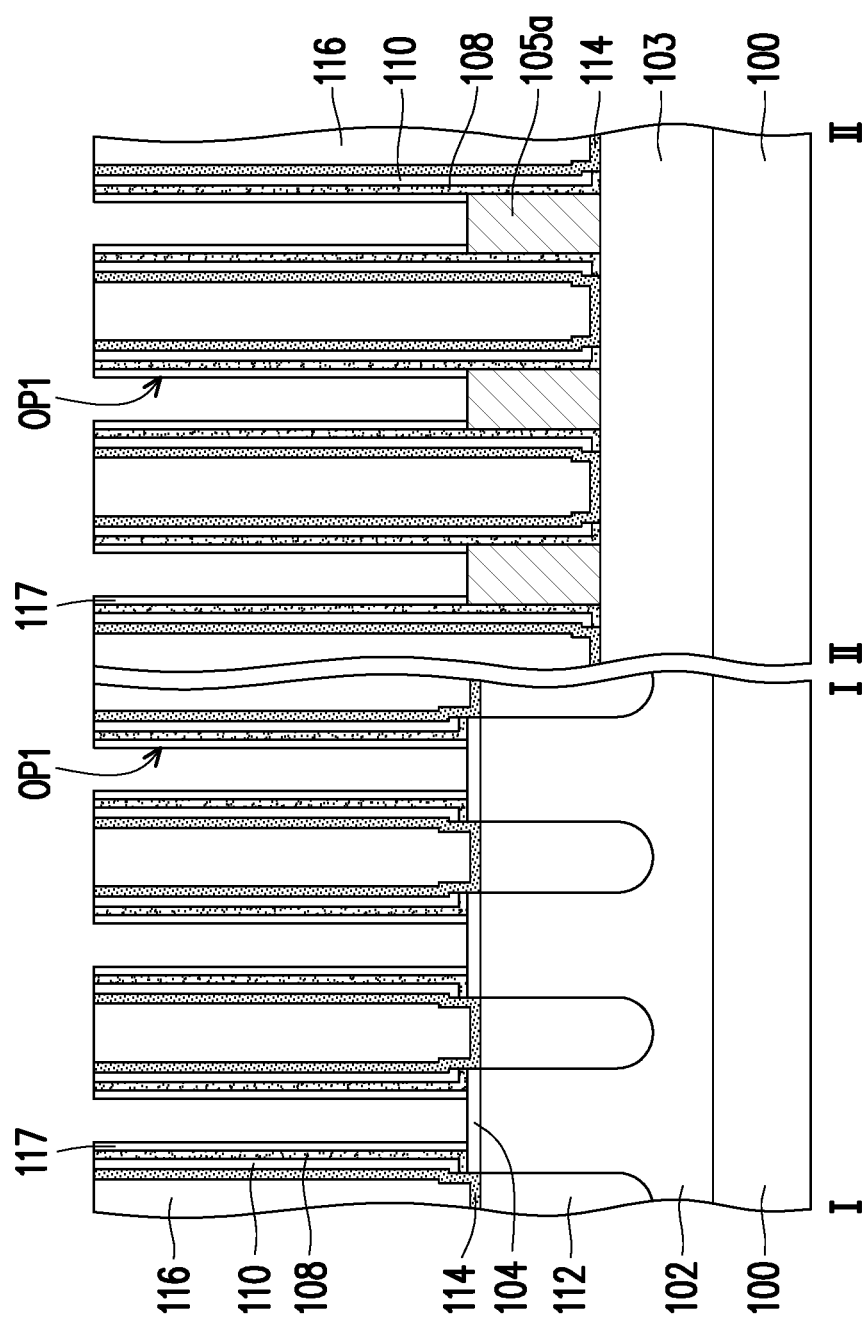

Referring to FIG. 2D, gate spacers 117 are formed on the opposing sidewalls of the first openings OP1, so as to narrow the width of the first openings OP1. In some embodiments, the method of forming the gate spacers 117 includes depositing a spacer material layer conformally on the substrate 100 filling in the first openings OP1, and performing an anisotropic process to remove the horizontal part but leave the vertical part of the spacer material layer. Alternatively, a selective LK-spacer deposition may be performed, so the gate spacers 117 are formed on the gate spacers 108 only. In some embodiments, each of the gate spacers 117 includes a low-k material having a dielectric constant less than about 4 or about 3.5. The low-k material may include SiCN, SiOC, SiOCN, or a material having a dielectric constant less than 4 (k<4). In some embodiments, the low-k material included in the gate spacers 117 may have a dielectric constant different from that of the low-k material included in the gate spacers 108 or 110. In alternative embodiments, the low-k material included in the gate spacers 117 may have a dielectric constant the same as that of the low-k material included in the gate spacers 108 or 110. In some embodiments, since the top surfaces of the interfacial layers 104 are substantially level with the top surfaces of the remaining dummy gate strips 105a, the gate spacers 117 formed on the interfacial layers 104 and the dummy gate strips 105a have even or substantially planar bottom surfaces.

Figure 2E:
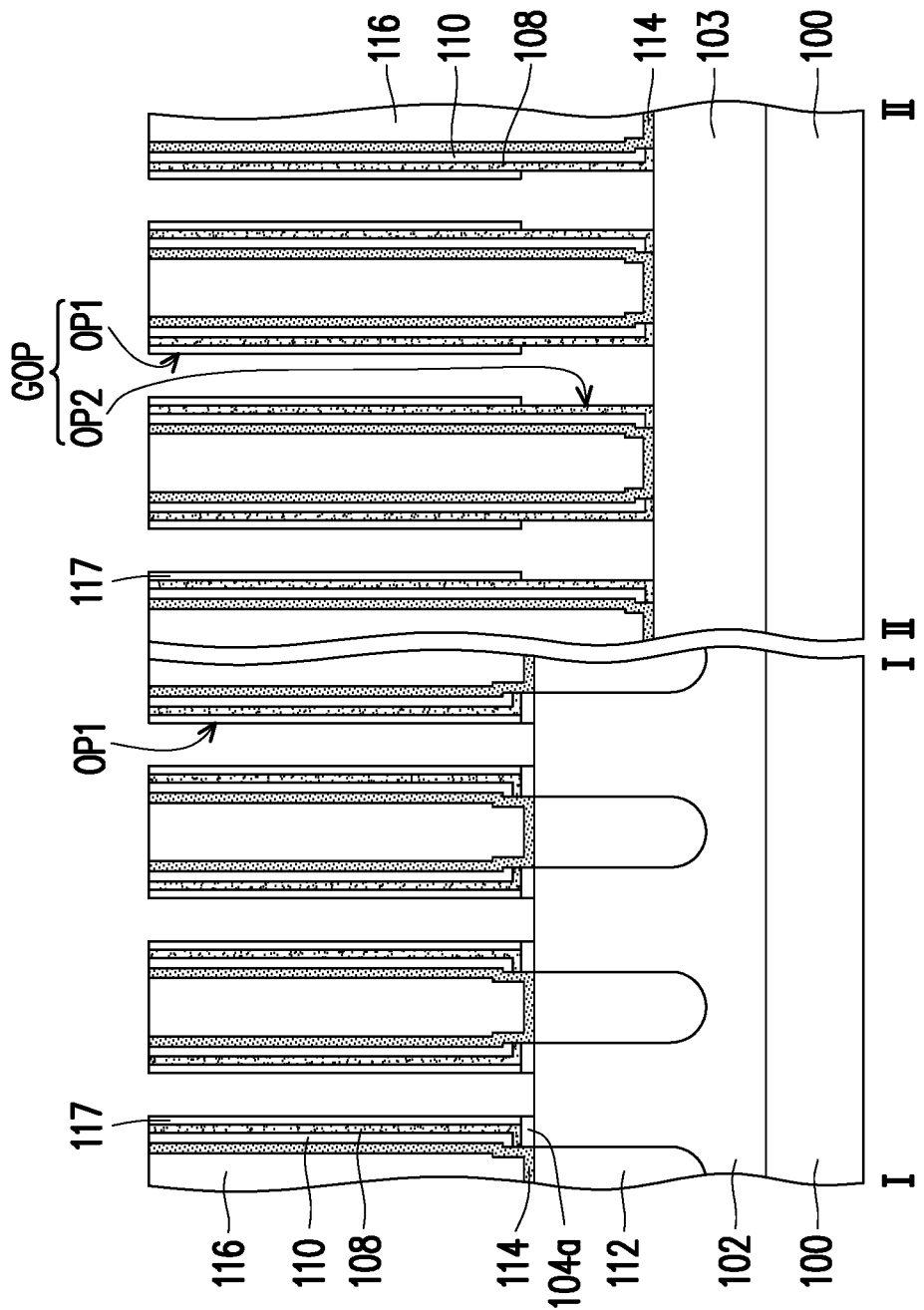

Referring to FIG. 2E, second portions of the dummy gate strips 105 (e.g., the remaining dummy gate strips 105a)

between two adjacent fins 102 are removed, and therefore, multiple second openings OP2 are formed below each of the first openings OP1. In some embodiments, the lower portions of the dummy gate strips 105 (e.g., the remaining dummy gate strips 105a) are removed by using the isolation layers 103 as etch stop layers, and thus, the dummy gate strips 105 are completely removed. In some embodiments, portions of the interfacial layers 104 are removed during the removal of the dummy gate strips 105a. The remaining interfacial layers 104 are referred to as interfacial layers 104a. In some embodiments, the interfacial layers 104a are disposed below the gate spacers 108, 110 and 117.

Upon the operations of FIG. 2D and FIG. 2E, the dummy gate strips 105 are completely removed to form gate openings GOP including first and second openings OP1 and OP2 in the dielectric layer 116. The first openings OP1 are disposed above the level of the fins 102, and the second openings OP2 are disposed below the level of the fins 102. Specifically, each of the first openings OP1 is a strip-like opening, and multiple separate second openings OP2 are located below and connected to the first opening OP1. The second openings OP2 protrude downwardly from the first opening OP1 toward the isolation strips 103. In some embodiments, the width of the first openings OP1 is less than the width of the corresponding second openings OP2. In some embodiments, a portion of a first opening OP1 has an I-shaped cross-section above each of the fins 102 (as shown in the I-I cross-sectional view of FIG. 2E), and another portion of the first opening OP1 and the corresponding second opening OP2 constitute a reversed T-shaped cross-section above the isolation strip 103 between two adjacent fins 102 (as shown in the II-II cross-sectional view in FIG. 2E).

Figure 2F:
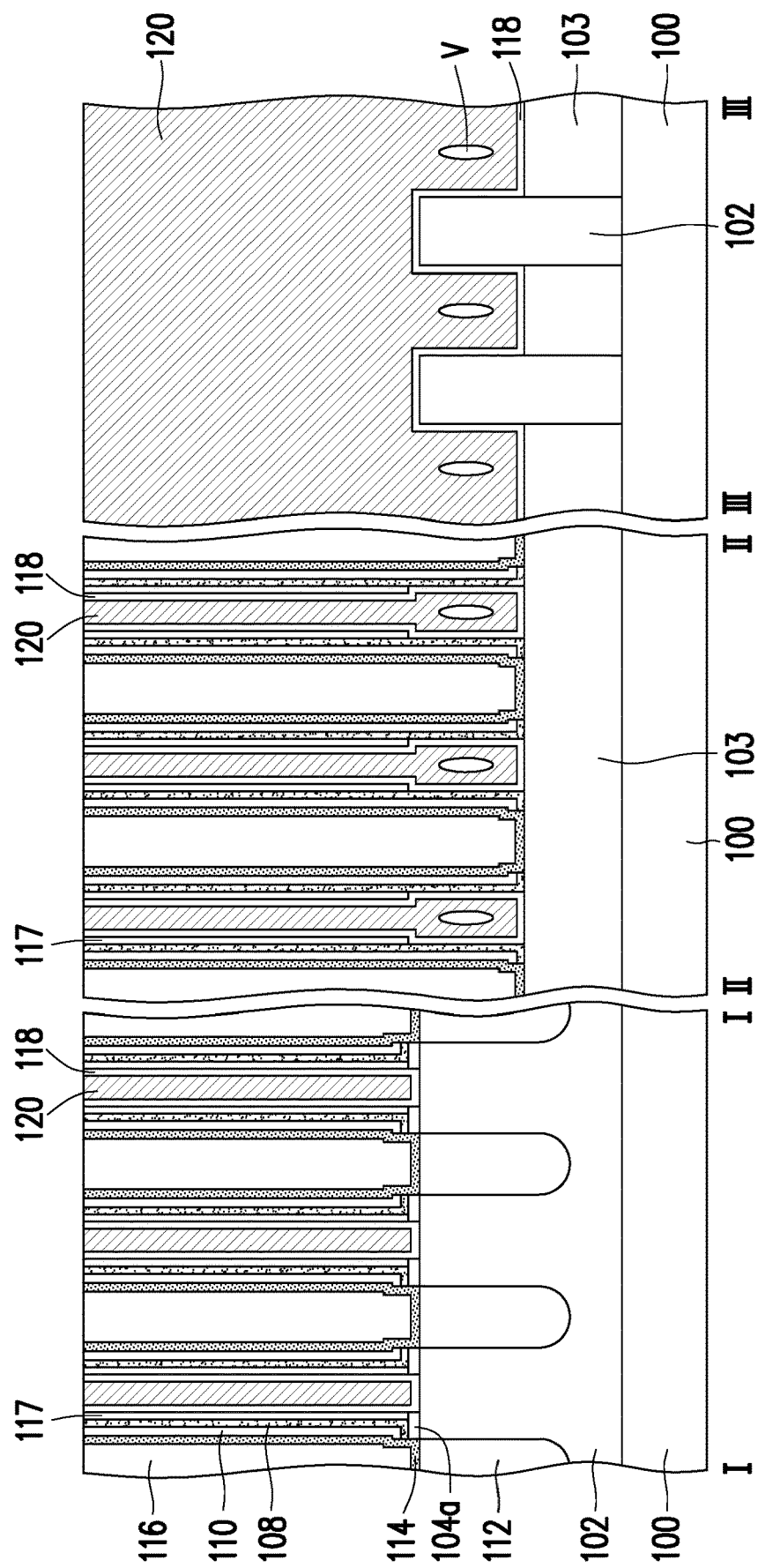

Referring to FIG. 2F, a metal layer 120 is formed in the first and second openings OP1 and OP2 (e.g., the gate openings GOP labelled in FIG. 2E). In some embodiments, during the metal layer 120 is formed, voids V may be generated in the metal layer 120 between two adjacent fins 102 since the gate openings GOP have narrower tops (e.g., first openings OP1) and wider bottoms (e.g., second openings OP2) for metal deposition. In some embodiments, the voids V are formed in the metal layer 120 below the top surfaces of the fins 102. Due to the disposition of the voids, the effective thickness of the metal layer 120 above the fins 102 is substantially the same as the effective thickness of the metal layer 120 between the fins 102, and thus, the Vt (threshold voltage) uniformity and therefore the device performance are accordingly improved.

In some embodiments, the metal layer 120 includes a work function metal layer and a fill metal layer on the work function metal layer. In some embodiments, the work function metal layer is a P-type work function metal layer to provide a gate electrode that properly performs in a P-type FinFET device. The P-type work function metal layer may include TiN, WN, TaN, conductive metal oxide, and/or a suitable material. In alternative embodiments, the work function metal layer is an N-type work function metal layer to provide a gate electrode that properly performs in an N-type FinFET device. The P-type work function metal layer may include TiAl, TiAlN, or TaCN, conductive metal oxide, and/or a suitable material. The fill metal layer includes copper (Cu), aluminum (Al), tungsten (W), or a suitable material. In some embodiments, the metal layer 120 may further include a liner layer, an interface layer, a seed layer, an adhesion layer, a barrier layer, a combination thereof or the like.

In some embodiments, a gate dielectric material layer 118 is formed after the operation of forming the gate openings GOP and before the operation of forming the metal layer 120. The gate dielectric material layer 118 may include a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, the gate dielectric material layer 118 may optionally include a silicate such as HfSiO, LaSiO, AlSiO, a combination thereof, or a suitable material. In some embodiments, upon the process requirements, an interfacial layer may be formed between the gate dielectric material layer 118 and each of the fins, and the interfacial layers include an amorphous layer such as an oxide-containing layer.

Figure 2G:
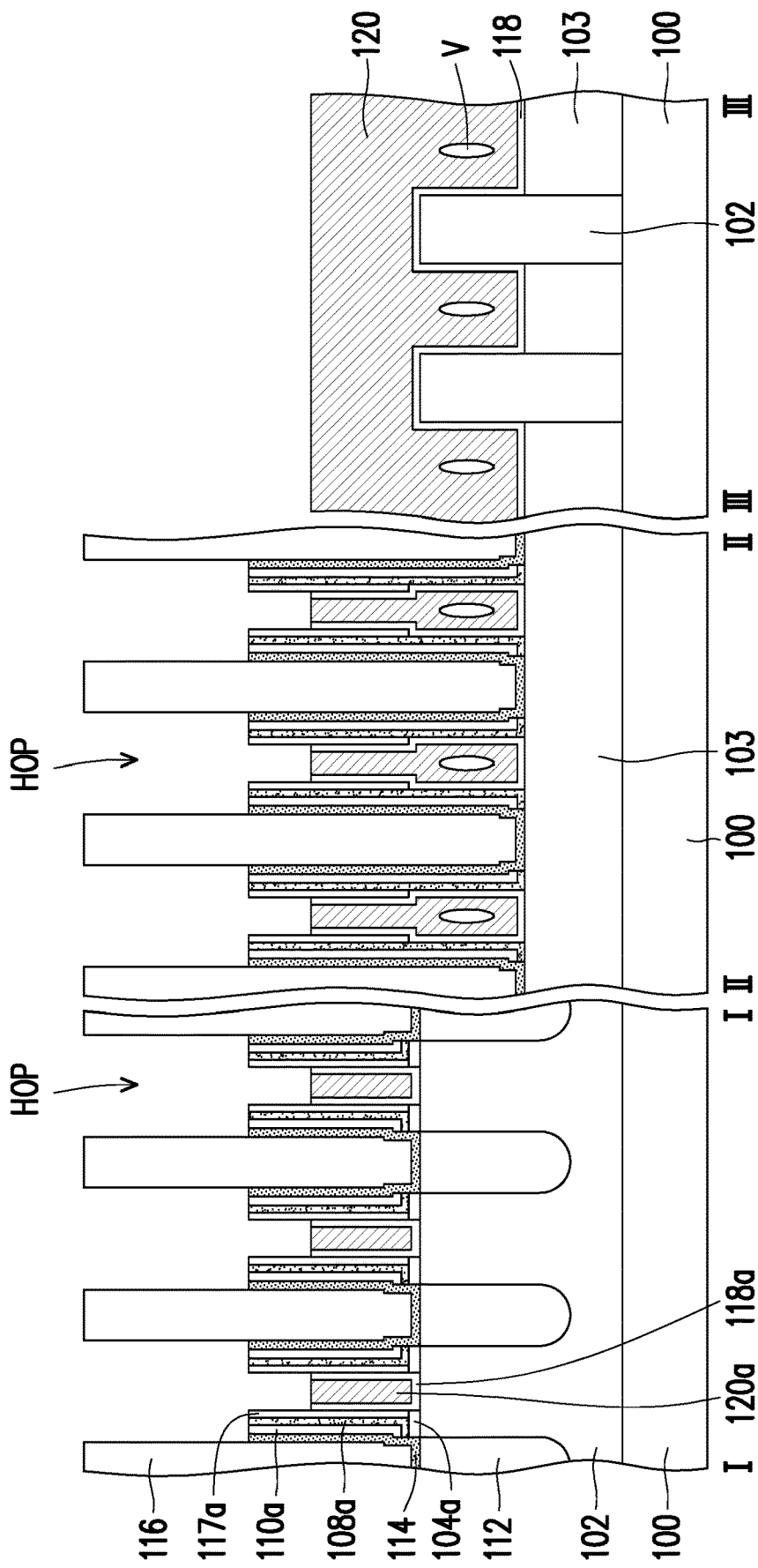

Referring to FIG. 2G, the metal layer 120 and the gate dielectric material layer 118 are partially removed to form metal gate strips 120a and gate dielectric layers 118a. In some embodiments, the gate spacers 108, 110 and 117 adjacent to the metal gate strips 120a are removed, so as to form helmet openings HOP in the dielectric layer 116. In some embodiments, the helmet openings HOP may have a T-shaped profile. The helmet openings HOP are provided for subsequent helmet deposition.

The method of forming the T-shaped helmet openings HOP may include the following operations. In some embodiments, the gate spacers 108, 110 and 117 are partially removed, until the top surfaces of the remaining gate spacers 108a, 110a and 117a are lower than the top surface of the dielectric layer 116. Thereafter, the metal layer 120 and the gate dielectric material layer 118 are partially removed, until the top surfaces of the metal gate strips 120a and gate dielectric layers 118a are lower than the top surfaces of the gate spacers 108a, 110a and 117a. In some embodiments, a portion of the etch stop layer 114 is removed during the partial removal of the metal layer 120 and the gate dielectric material layer 118. The top surface of the remaining etch stop layer 114 is substantially coplanar with the top surfaces of the gate spacers 108a, 110a and 117a.

In some embodiments, the gate spacers 108, 110 and 117 are partially removed after the operation of partially removing the metal layer 120 and the gate dielectric material layer 118. However, the present disclosure is not limited thereto. In alternative embodiments, the gate spacers 108, 110 and 117 are partially removed before the operation of partially removing the metal layer 120 and the gate dielectric material layer 118.

In some embodiments, the gate dielectric layers 118a and the metal gate strips 120a constitute metal gate stacks (or called "replacement gate stacks"). In some embodiments, the metal gate stacks extend in a direction different from (e.g., perpendicular to) the extending direction of the fins 102. In some embodiments, the gate dielectric layers 118a respectively surround the sidewalls and bottoms of the metal gate strips 120a and on the tops and sidewalls of the fins 102, as shown in FIG. 2G. In some embodiments, optional interfacial layers such as silicon oxide layers are formed between the fins 102 and the gate dielectric layers 118a. In some embodiments, the metal gate strips 120a are formed with voids V therein. In some embodiments, the voids V are formed in the metal gate strips 120a below the top surfaces of the fins 102 and between two adjacent fins 102.

Figure 2H:
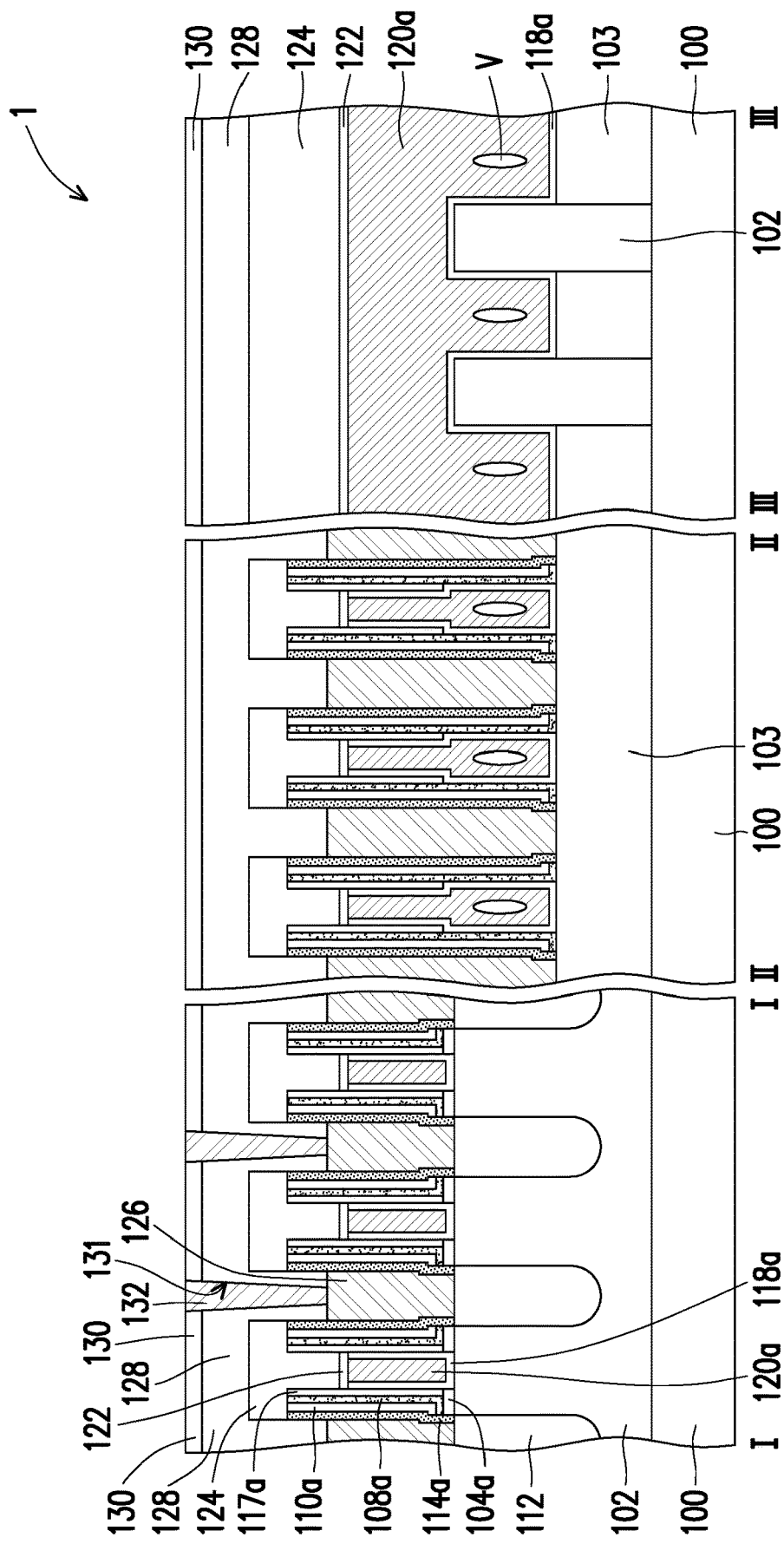

Referring to FIG. 2H, dielectric helmets 124 are respectively formed in the helmet openings HOP. In some embodiments, the dielectric helmets 124 include metal oxide, metal nitride or a combination thereof. The metal oxide may include $ZrO_2$, $HfO_2$, $TiO_2$, $Al_2O_3$ or the like. The metal nitride may include ZrN, HfN, TiN, AlN or the like. The materials of the dielectric helmets 124 are not limited by the present disclosure. Other materials may be applied as long as these materials serve as hard masks for protecting the underlying gates from being damaged by the subsequently processes. For example, the dielectric helmets 124 may include a high-k material having a dielectric constant greater than 7, a low-k material having a dielectric constant less than 7 or a combination thereof. Each of the dielectric helmets 124 may be a single-layer or multi-layer structure. The dielectric helmets 124 may include a high-k material or a low-k material or both. The high-k material may include $HfO_2$, $ZrO_2$, HfAlOx, HfSiOx, $Al_2O_3$ or a material having a dielectric constant greater than 7 (k>7). The low-k material may include SiCN, SiOC, SiOCN or a material having a dielectric constant less than 7 (k<7). In some embodiments, the dielectric helmets 124 are formed by a suitable deposition process followed by a planarization process.

In some embodiments, optional shielding layers 122 are respectively formed between the metal gate strips 120a and the dielectric helmets 124. In some embodiments, the shielding layers 122 include metal such as tungsten (W), cobalt (Co), copper (Cu), titanium (Ti) or the like, and the forming method thereof includes performing a selective ALD process. The shielding layers 122 and the dielectric helmets 124 are configured to protect the metal gate strips 120a from being damaged by the subsequent processes. In some embodiments, the shielding layers 122 are referred to as contact etch stop layers.

Still referring to FIG. 2H, the dielectric layer 116 and horizontal part of the etch stop layer 114 are removed to form gaps that expose the strained layers 112. The remaining etch stop layer 114 forms etch stop patterns 114a respectively at outer sides of the gate spacers 110a. Specifically, the etch stop patterns 114a are arranged to surround lower parts of the dielectric helmets 124, and the edges of the etch stop patterns 114a are aligned with the edges of the corresponding dielectric helmets 124.

Thereafter, metal stacks 126 are formed in lower portions of the gaps between metal gate strips 120a. In some embodiments, the top surfaces of the metal gate strips 126 are higher than the top surfaces of the metal gate strips 120a, but the present disclosure is not limited thereto. In alternative embodiments, the top surfaces of the metal gate strips 126 may be substantially coplanar with the top surfaces of the metal gate strips 120a. In some embodiments, the metal stacks 126 include metal such as tungsten (W), cobalt (Co), copper (Cu), titanium (Ti) or the like, and the forming method thereof includes performing a suitable deposition process followed by an etching back process. In some embodiments, optional metal shielding layers or contact etch stop layers are respectively formed over the metal stacks 126.

Thereafter, a first dielectric layer 128 is formed over the substrate 100, covering the dielectric helmets 124 and filling upper portions of the gaps. In some embodiments, the first dielectric layer 128 includes SiN, SiC or the like. In some embodiments, the first dielectric layer 128 is referred to as a contact etch stop layer. Afterwards, a second dielectric layer 130 is formed over the first dielectric layer 128. In some embodiments, the second dielectric layer 130 includes oxide such as silicon oxide, phosphosilicate glass (PSG), borosilicate glass (BSG), boron-doped phosphosilicate glass (BPSG), a combination thereof or the like. Each of the first dielectric layer 128 and the second dielectric layer 130 is formed by a suitable deposition technique such as spin-coating, CVD, PVD, ALD, a combination thereof or the like.

Still referring to FIG. 2H, the second dielectric layer 130 and the first dielectric layer 128 are patterned or partially removed, so as to form contact openings 131 (or called "contact holes") corresponding to the strained layers 112. In some embodiments, after the second dielectric layer 130 is formed, a hard mask layer with multiple openings is formed on the second dielectric layer 130. The openings of the hard mask layer may correspond to the intended locations of the subsequently formed contact holes. In some embodiments, the hard mask layer includes a photoresist material, a dielectric material or a combination thereof. Thereafter, portions of the second dielectric layer 130, the first dielectric layer 128 and the dielectric helmets 124 are etched by using the hard mask layer as an etch mask. In some embodiments, the contact openings 131 penetrate through the second dielectric layer 130 and the first dielectric layer 128 and expose the corresponding metal stacks 126. The contact openings 131 may have tilted sidewalls.

Still referring to FIG. 2H, source and drain contacts 132 are respectively formed in the contact openings 131. In some embodiments, the source and drain contacts 132 are intended to represent any type of conductive materials and structures that are electrically connected to the metal gate strips 120a. In some embodiments, the source and drain contacts 132 are formed through the second dielectric layer 130 and the first dielectric layer 128 and in physical contact with the corresponding metal stacks 126. In some embodiments, as shown in FIG. 2H, the source and drain contacts 132 are separated from the etch stop patterns 114a, the dielectric helmets 124 and the gate spacers 108a, 110a and 117a. However, the present disclosure is not limited thereto. In alternative embodiments, at least one of the source and drain contacts 132 is in physical contact with the adjacent etch stop patterns 114a, the dielectric helmets 124 and/or the gate spacers 108a, 110a and 117a. In some embodiments, the top surfaces of the source and drain contacts 132 are substantially coplanar with the top surface of the second dielectric layer 130.

In some embodiments, gate contacts may be further formed to electrically connect to the corresponding metal gate strips 120a. In some embodiments, the contact openings for the gate contacts are defined during the operation of forming the source and drain contact openings, and the gate contacts are formed during the operation of forming the source and drain contacts 132. In alternative embodiments, the gate contacts may be formed before or after the operation of forming the source and drain contacts 132. In some embodiments, the gate contacts are formed through the second dielectric layer 130, the first dielectric layer 128 and the dielectric helmets 124 and in physical contact with the corresponding shielding layers 122. In some embodiments, the gate contacts are separated from the adjacent gate spacers 108a, 110a and 117a. However, the present disclosure is not limited thereto. In alternative embodiments, at least one of the gate contacts is in physical contact with the adjacent gate spacers 108a, 110a and 117a.

The FinFET device 1 of the disclosure is thus completed with the described process operations. However, it is not limited to add one or more additional operations among the above operations for fabricating the FinFET device. The disclosure can be applied to nano-wires, nano-sheets or similar devices.

Figure 3:
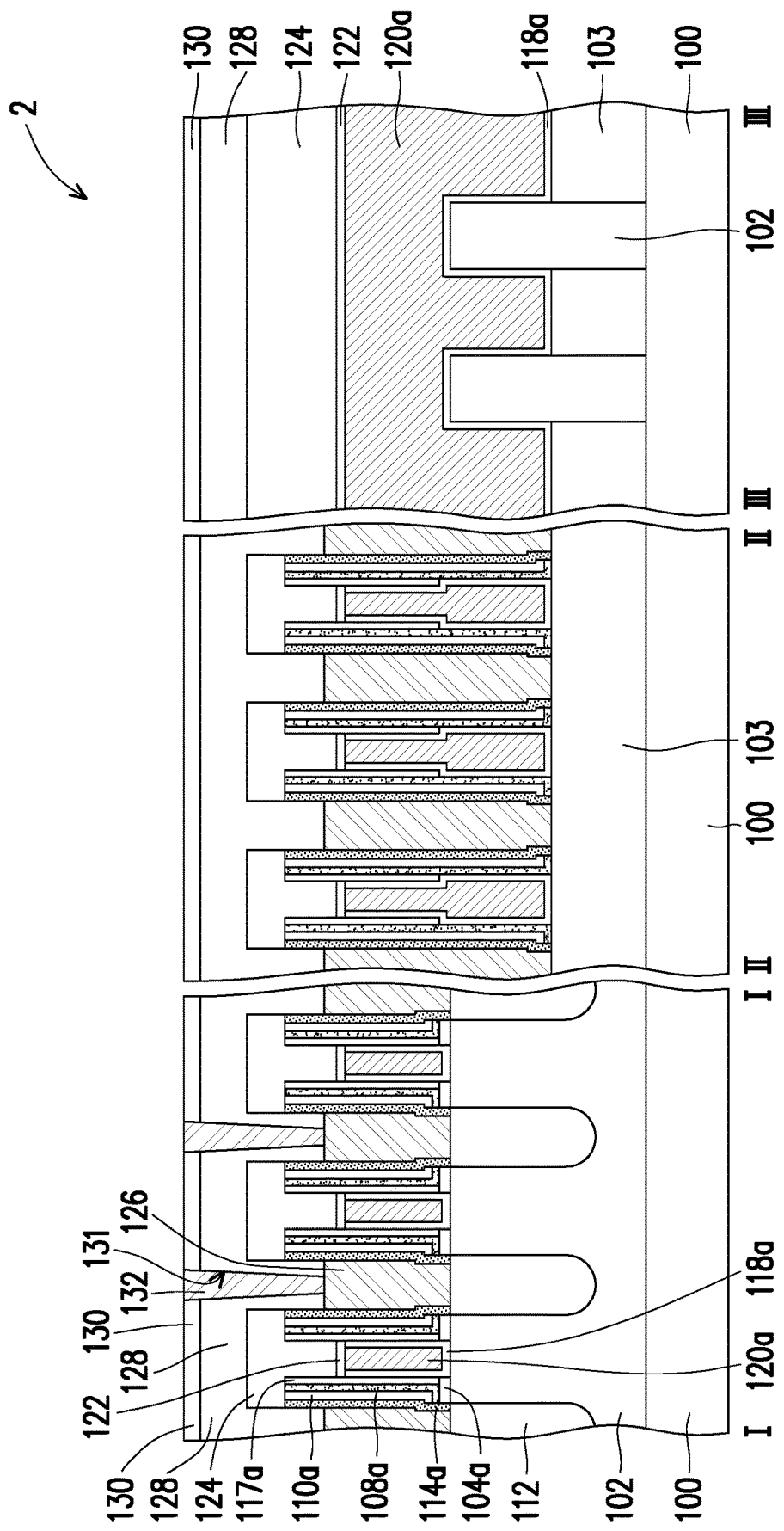
FIG. 3 is a schematic cross-sectional view of a FinFET device in accordance with alternative embodiments.

The above embodiments in which the metal gate strips are formed with voids V therein are provided for illustration purposes, and are not construed as limiting the present disclosure. In some embodiments, when the gate pitch is larger, the metal gate strips are formed without voids (as shown in FIG. 3) even though the gate openings have narrow tops for metal deposition.

The structures of the FinFET devices of the disclosure are described below with reference to FIG. 1 and FIG. 2H and FIG. 3.

In some embodiments, the FinFET device 1/2 of the disclosure includes a substrate 100 having fins 102, multiple isolation strips 103, at least one metal gate strip 120a, gate spacers 108a, 110a and 117a, first and second dielectric layers 128 and 130, and a dielectric helmet 124.

The fins 102 extend in a first direction. The isolation strips 103 are disposed over the substrate 100 and covers lower portions of the fins 102. Specifically, the isolation strips 103 and the fins 102 are arranged alternately.

Each of the metal gate strips 120a is disposed across the fins 102 and the isolation strips 103 and has a reversed T-shaped portion on the isolation strips 103 between two adjacent fins 102, as shown in the top view of FIG. 1 and the II-II cross-section views of FIG. 2H and FIG. 3. Besides, the metal gate strip 120a has an I-shaped portion on each of the fins 102, as shown in the top view of FIG. 2 and the I-I cross-section views of FIG. 2H and FIG. 3. Specifically, along the extension direction of the metal gate strip 120a, multiple reversed T-shaped portions and multiple I-shaped portions are arranged alternately.

In some embodiments, the metal gate strip 120a has voids V in the reversed T-shaped portions thereof, as shown in FIG. 2H. In some embodiments, the voids V are disposed below the top surfaces of the fins 102 and between two adjacent fins 102. In some embodiments, no void is present in the I-shaped portions of the metal gate strip 120a. However, the present disclosure is not limited thereto. In alternative embodiments, the metal gate strip 120a is void-free, as shown in FIG. 3.

The gate spacers 108a, 110a and 117a are disposed on opposing sidewalls of the metal gate strip 120a. The dielectric helmet 124 is disposed over the metal gate strip 120a. The first and second dielectric layer 128 and 130 are disposed over and around the metal gate strip 120a or the dielectric helmet 124. In some embodiments, the dielectric helmet 124 has a T-shaped cross-section.

The gate spacers include gate spacers 108a/110a disposed on the opposing entire sidewalls of the metal gate strip 120a, and gate spacers 117a disposed on the opposing upper sidewalls of the metal gate strip 120a, and the gate spacers 117a are disposed between the gate spacers 108a/110a and the metal gate strip 120a. In some embodiments, each of the gate spacers 108a/110a has an uneven or wavy bottom while each of the gate spacers 117a has an even or substantially planar bottom. In some embodiments, the gate spacers 110a have an L-shaped cross-section, and the gate spacers 117a have an I-shaped cross-section. Besides, the gate spacers 108a may have an L-shaped cross-section or an I-shaped cross-section as needed. The gate spacers 108a/110a are protruded out from the top surface of the metal gate strip 120a.

In some embodiments, the FinFET device 1/2 further includes a metal stack 126, an etch stop pattern 114a, and a source and drain contact 132. The metal stack 126 is disposed aside the metal gate strip 120a and over a strained layer 112. The source and drain contact 132 penetrates through the first and second dielectric layers 128 and 130 and is electrically connected to the metal stack 126. The etch stop pattern 114a is disposed between the metal stack 126 and the metal gate strip 120a. In some embodiments, the top surface of the etch stop pattern 114a is higher than the top surface of the metal gate strip 120a, and substantially as level as the top surfaces of the gate spacers 108a, 110a and 117a. In some embodiments, the etch stop pattern 114a is disposed between the first dielectric layer 128 and the gate spacers 110a and aside the lower part of the dielectric helmet 124.

In some embodiments, a metal shielding layer 122 is further included between the dielectric helmet 124 and the metal gate strip 120a. Besides, optional metal shielding layers may be further disposed between the source and drain contact 132 and the metal stack 126.

The above embodiments in which each of the gate dielectric layers, the metal gate strips, the gate spacers, the dielectric layers, the shielding layers, and the contacts is a single layer are provided for illustration purposes, and are not construed as limiting the present disclosure. In some embodiments, at least one of these described components may be a multi-layer structure as needed.

In view of the above, in some embodiments, a strong protection structure is provided around a contact structure, so as to prevent unwanted electrical connection between the contact and the adjacent metal gate strip. Specifically, the protection structure of the disclosure includes thicker upper gate spacers (including gate spacers 108a, 110a and 117a) aside the metal gate strip and a helmet (e.g., dielectric helmet 124) over the metal gate strip. Due the disposition of the thicker upper gate spacers, wider lithography/etching process window, less lithography overlay requirement, better channel isolation, and greater contact-to-gate distance are gained. Therefore, the conventional metal gate damage is not observed, and the performance and reliability of the device are accordingly improved. Besides, thinner lower gate spacers (e.g., including gate spacers 108a and 110a) are provided aside the metal gate strip, so as to enlarge metalized drain etching (MD ET) window and provide better gate control. With the reversed T-shaped gate profile of the disclosure, the device performance such as short channel effect (SCE), metalized drain etching (MD ET) and time dependent dielectric breakdown (TDDB) requirements can be easily achieved.

In some embodiments, voids are provided in the bottom portion of the metal gate strip. Such voids enable the work function metal layer have substantially effective thickness, and thus, the Vt uniformity and therefore the device performance are accordingly improved.

In the above-mentioned embodiments, a "gate last" process is implemented to form a FinFET device. However, another process such as a "gate first" process or another type of device (e.g., planar device) may be applied by using similar processes as described herein. The methods disclosed herein may be easily integrated with a CMOS process flow and do not require additional complicated operations to achieve the desired results. It is understood that embodiments disclosed herein offer different advantages, and that no particular advantage is necessarily required for all embodiments.

In accordance with some embodiments of the present disclosure, a FinFET device includes a substrate, a metal gate strip, gate spacers and a dielectric helmet. The substrate has fins. The metal gate strip is disposed across the fins and has a reversed T-shaped portion between two adjacent fins. The gate spacers are disposed on opposing sidewalls of the metal gate strip. A dielectric helmet is disposed over the metal gate strip.

In accordance with alternative embodiments of the present disclosure, a FinFET device includes a substrate having fins, isolation strips and a metal gate strip. The isolation strips are disposed over the substrate and covers lower portions of the fins. The metal gate strip is disposed across the fins and the isolation strips and has voids disposed over the isolation strips and between the fins.

In accordance with yet alternative embodiments of the present disclosure, a method of forming a FinFET device that includes the following operations. A substrate is provided with fins. A dummy gate strip is formed across the fins, and the dummy gate strip has first gate spacers on opposing sidewalls thereof. A dielectric layer is formed around the dummy gate strip. A first portion of the dummy gate strip above the fins is removed, and therefore, a first opening is formed in the dielectric layer. Second gate spacers are formed on opposing sidewalls of the first opening. A second portion of the dummy gate strip between two adjacent fins is removed, and therefore, a second opening is formed below the first opening. A metal layer is formed in the first and second openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET device, comprising:
   a substrate having fins;
   a metal gate strip disposed across the fins and having a reversed T-shaped portion in a cross section cut between two adjacent fins along an extension direction of the fins, wherein a portion of the reversed T-shaped portion is embedded between the two adjacent fins;
   multiple gate spacers disposed on a first sidewall of the metal gate strip;
   a T-shaped dielectric helmet disposed over the metal gate strip;
   an interfacial layer disposed below the multiple gate spacers, wherein laterally opposite sidewalls of the interfacial layer are flush with sidewalls of the multiple gate spacers; and
   an etch stop layer disposed on the first sidewall of the metal gate strip covering the multiple gate spacers, wherein outer sidewalls of the T-shaped dielectric helmet are flush with sidewalls of the etch stop layer.

2. The FinFET device of claim 1, wherein the metal gate strip has a straight-shaped portion on each of the fins.

3. The FinFET device of claim 1, wherein a top surface of the metal gate strip is lower than top surfaces of the multiple gate spacers.

4. The FinFET device of claim 1, wherein the T-shaped dielectric helmet comprises metal oxide, metal nitride or a combination thereof.

5. The FinFET device of claim 1, wherein a bottom surface of the interfacial layer is flush with a bottom surface of a gate dielectric layer disposed between the metal gate strip and the fins.

6. The FinFET device of claim 1, wherein the etch stop layer further covers the interfacial layer.

7. The FinFET device of claim 1, wherein the metal gate strip is void-free.

8. The FinFET device of claim 1, wherein the T-shaped dielectric helmet covers top surfaces of the multiple gate spacers.

9. A FinFET device, comprising:
   a substrate having fins;
   a metal gate strip disposed across the fins and having a reversed T-shaped portion in a cross section cut between two adjacent fins along an extension direction of the fins, wherein the reversed T-shaped portion has a bottom wide portion embedded between the two adjacent fins and a top narrow portion on the bottom wide portion;
   a first gate spacer disposed on a sidewall of the top narrow portion and the bottom wide portion of the metal gate strip;
   a second gate spacer disposed between the first gate spacer and the top narrow portion of the metal gate strip and landed on a top of the bottom wide portion of the metal gate strip;
   an etch stop layer disposed on a sidewall of the first gate spacer;
   a metal stack disposed aside the etch stop layer; and
   a T-shaped dielectric helmet disposed over the metal gate strip,
   wherein a top surface of the metal stack is higher than a top surface of the metal gate strip but lower than a top surface of the T-shaped dielectric helmet, and
   wherein outer sidewalls of the T-shaped dielectric helmet are flush with sidewalls of the etch stop layer.

10. The FinFET device of claim 9, wherein voids are disposed below top surfaces of the fins.

11. The FinFET device of claim 9, wherein a void is not present on each of the fins.

12. The FinFET device of claim 9, wherein the T-shaped dielectric helmet comprises metal oxide, metal nitride or a combination thereof.

13. The FinFET device of claim 9, wherein the metal gate strip is void-free.

14. The FinFET of claim of claim 9, wherein an interfacial layer is disposed below the first and second gate spacers, and a bottom surface of the interfacial layer is flush with a bottom surface of a gate dielectric layer disposed between the metal gate strip and the fins.

15. A FinFET device, comprising:
   a substrate having fins;
   a metal gate strip disposed across the fins and having a reversed T-shaped portion in a cross section cut between two adjacent fins along an extension direction of the fins, wherein a portion of the reversed T-shaped portion is embedded between the two adjacent fins;
   multiple gate spacers disposed on a first sidewall of the metal gate strip;
   a T-shaped dielectric helmet disposed over the metal gate strip;
   an interfacial layer disposed below the multiple gate spacers, wherein laterally opposite sidewalls of the interfacial layer are flush with sidewalls of the multiple gate spacers;
   an etch stop layer disposed on the first sidewall of the metal gate strip covering the multiple gate spacers, wherein outer sidewalls of the T-shaped dielectric helmet are flush with sidewalls of the etch stop layer; and
   a metallic material layer disposed between the T-shaped dielectric helmet and the metal gate strip and in contact with a top surface of a gate dielectric layer.

16. The FinFET device of claim 15, wherein the metallic material layer is in contact with the metal gate strip but separated from the etch stop layer.

17. The FinFET device of claim 15, wherein the metallic material layer comprises tungsten (W), cobalt (Co), copper (Cu), or titanium (Ti).

18. The FinFET device of claim 15, wherein the metal gate strip has voids therein.

19. The FinFET device of claim 15, wherein the metal gate strip is void-free.

20. The FinFET device of claim 15, wherein the etch stop layer further covers the interfacial layer.

\* \* \* \* \*